United States Patent
Harris

(10) Patent No.: US 6,465,862 B1
(45) Date of Patent: Oct. 15, 2002

(54) METHOD AND APPARATUS FOR IMPLEMENTING EFFICIENT CMOS PHOTO SENSORS

(76) Inventor: Brannon Harris, 137 Wilder Ave., Los Gatos, CA (US) 95123

( * ) Notice: Subject to any disclaimer, the term of this patent is extended or adjusted under 35 U.S.C. 154(b) by 0 days.

(21) Appl. No.: 09/413,096

(22) Filed: Oct. 5, 1999

(51) Int. Cl.[7] ............................................. H01L 31/06
(52) U.S. Cl. ...................... 257/463; 257/464; 257/232; 257/292; 257/446; 438/48; 438/87
(58) Field of Search ............................... 257/292, 232, 257/446, 463, 464; 438/48, 87

(56) References Cited

U.S. PATENT DOCUMENTS

| | | | |
|---|---|---|---|
| 5,461,425 A | 10/1995 | Fowler et al. ............... 348/294 |
| 5,471,515 A | 11/1995 | Fossum et al. ............... 377/60 |
| 5,548,773 A | 8/1996 | Kemeny et al. .......... 250/208.1 |
| 5,665,959 A | 9/1997 | Fossum et al. .......... 250/208.1 |
| 5,780,884 A | 7/1998 | Kumagai et al. ............ 257/292 |
| 5,841,125 A | 11/1998 | Livingston ............... 250/208.1 |
| 5,841,126 A | 11/1998 | Fossum et al. .......... 250/208.1 |
| 5,850,195 A | 12/1998 | Berlien et al. ............... 341/137 |
| 5,859,450 A | * 1/1999 | Clark et al. ................... 257/233 |
| 5,861,645 A | 1/1999 | Kudo et al. .................. 257/291 |
| 5,861,655 A | * 1/1999 | Kozuka et al. .............. 257/446 |
| 5,869,857 A | 2/1999 | Chen ............................ 257/292 |
| 5,880,691 A | 3/1999 | Fossum et al. ............. 341/162 |
| 5,886,659 A | 3/1999 | Pain et al. .................... 341/155 |
| 5,949,483 A | 9/1999 | Fossum et al. ............. 348/303 |
| 5,965,871 A | 10/1999 | Zhou et al. ............... 250/208.1 |
| 5,969,758 A | 10/1999 | Sauer et al. ................. 348/241 |
| 5,981,932 A | 11/1999 | Guerrieri et al. ........ 250/208.1 |
| 5,990,506 A | 11/1999 | Fossum et al. ............. 257/294 |
| 5,995,163 A | 11/1999 | Fossum et al. ............. 348/572 |
| 6,072,206 A | * 6/2000 | Yamashita et al. .......... 257/292 |
| 6,090,639 A | * 7/2000 | Pan .............................. 438/59 |

OTHER PUBLICATIONS

Masakazu Aoki et al. (Feb. 13, 1980) Advances in CCD and Imaging.
Shinya Ohba et al. (1995 IEEE) Vertical Smear Noise Model for an MOS–Type Color Imager.
D. Renshaw et al. (1990 IEEE) Asic Vision.
John E. Tanner (SPIE vol. 1155 1989) A High–speed Video Camera and Recorder.
D Renshaw et al. (1990 IEEE) Asic Image Sensors.
P.B. Denyer et al. (1993 IEEE) CMOS Image Sensors for Multimedia Applications.
Orly Yadid–Pecht et al. (1991 IEEE)( A random Access Photodiode Array for Intelligent Image Capture.
Fumihiko Andoh (ISSCC 1990) Image Sensors, Processors, and Displays.
Peter J.W. Noble (1968 IEEE) Self–Scanned Silicon Image Detector Arrays.

* cited by examiner

*Primary Examiner*—Steven Loke
*Assistant Examiner*—Donghee Kang
(74) *Attorney, Agent, or Firm*—Dag Johansen; Stattler Johansen & Adeli LLP

(57) ABSTRACT

Semiconductor photo sensor and semiconductor wafer processing designs are disclosed. The disclosed designs provide significantly improved photo sensor performance within the framework of a CMOS process. CMOS compatible fabrication procedures are presented, that enable tailoring of the 3-dimensional doping profile and defect structure within a photo sensor, to optimize light detection efficiency and minimize noise from dark current.

10 Claims, 7 Drawing Sheets

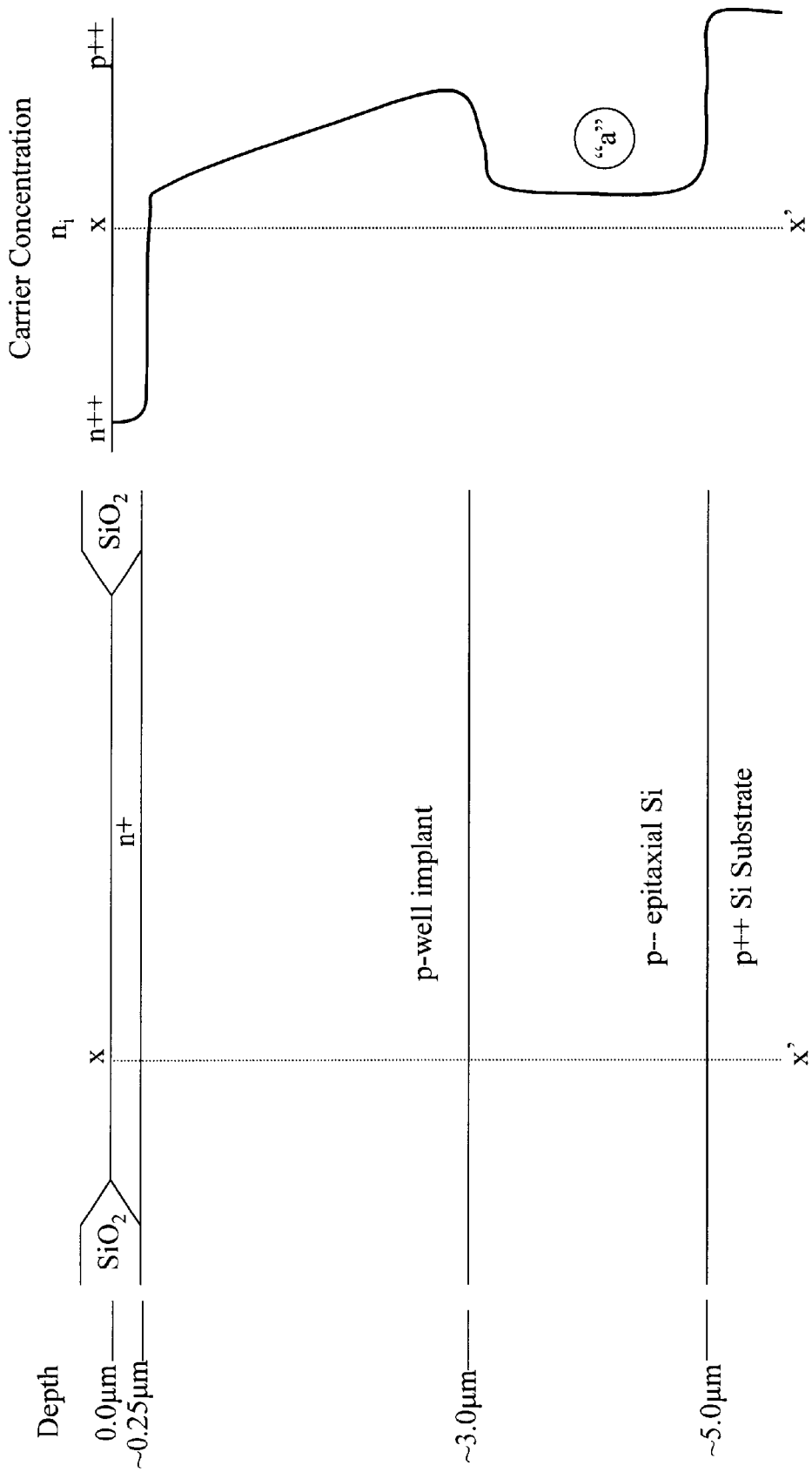

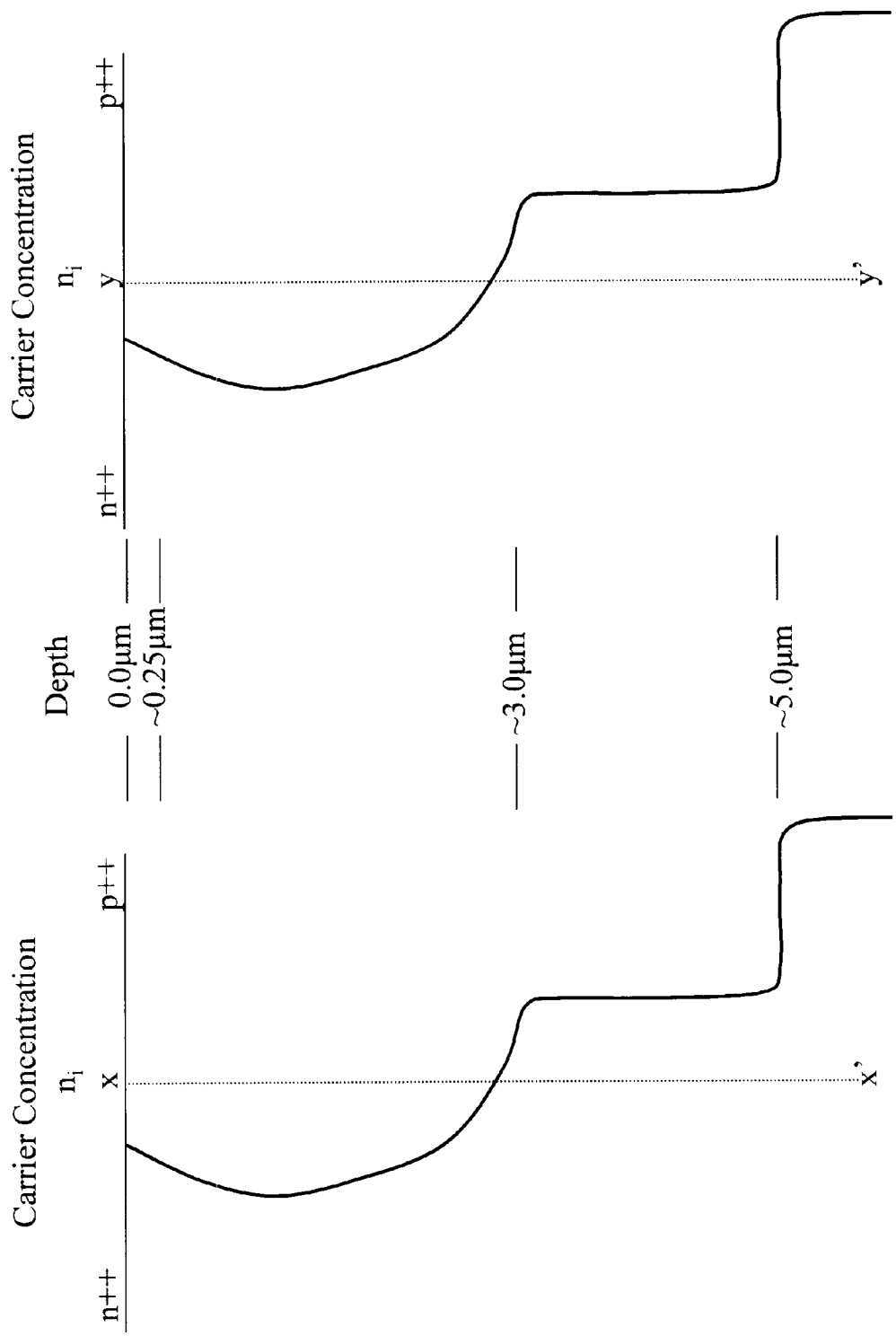

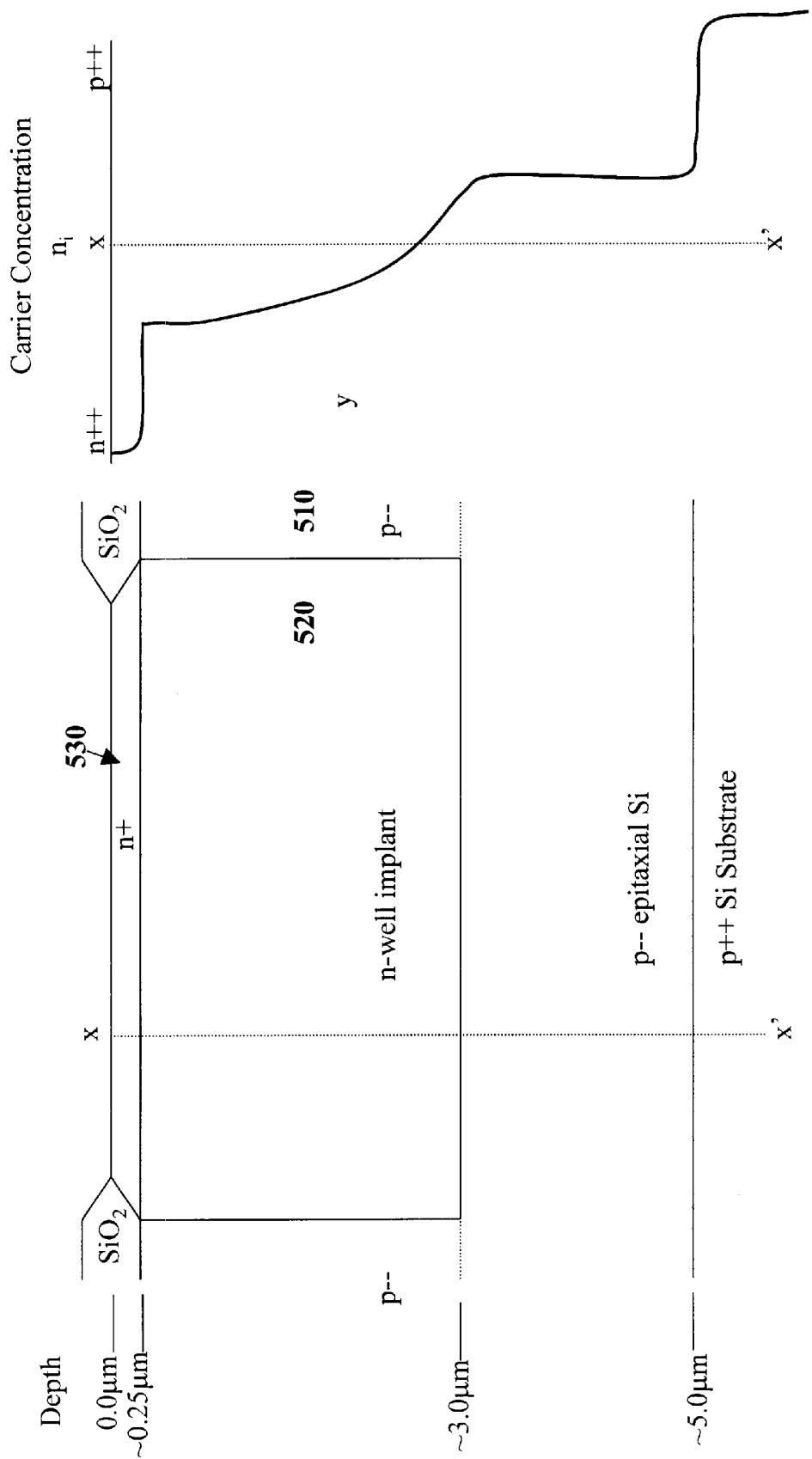

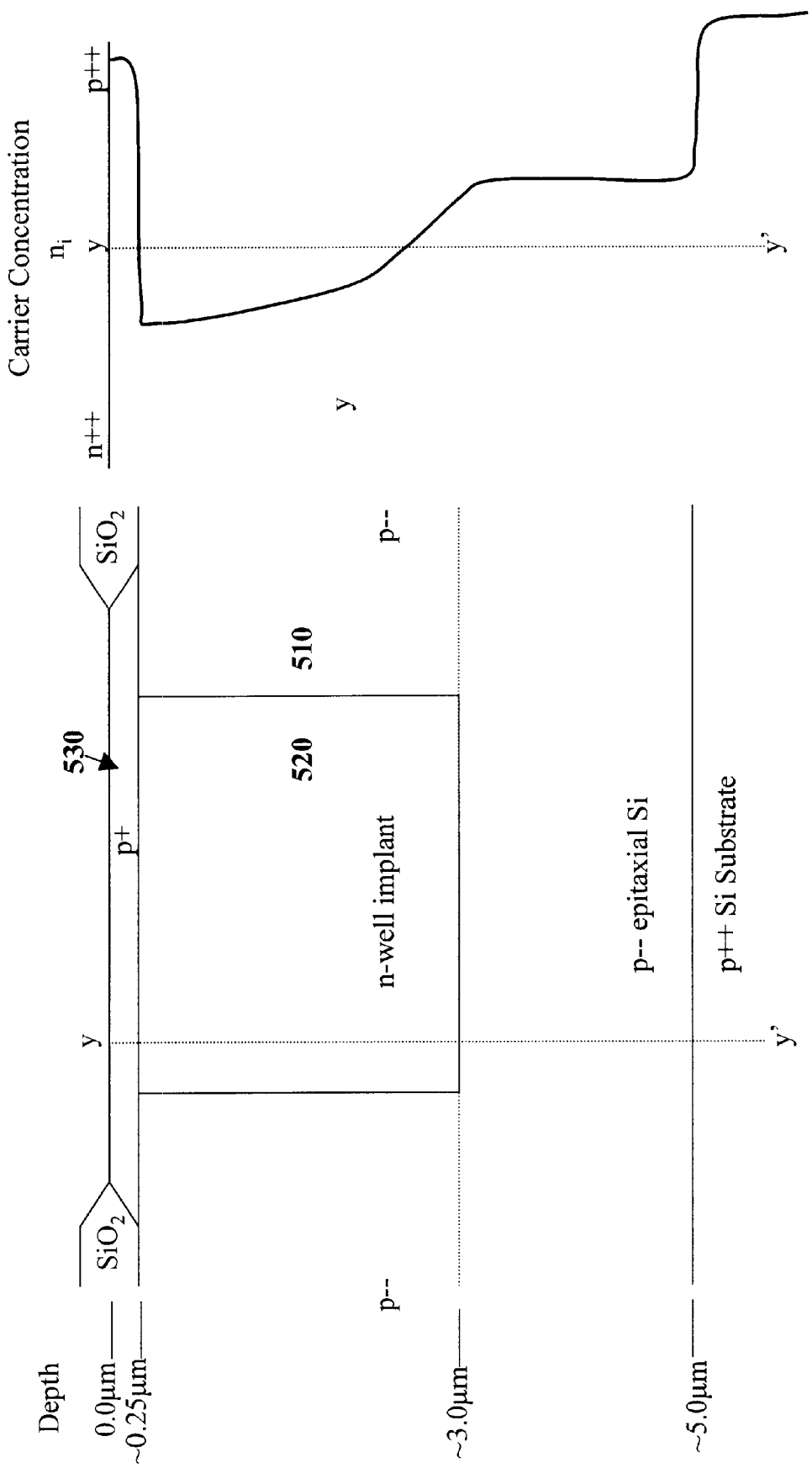

METHOD AND APPARATUS FOR IMPLEMENTING EFFICIENT CMOS PHOTO SENSORS

FIELD OF THE INVENTION

The present invention relates to the field of electronic image sensor circuits. In particular, the present invention relates to CMOS photo sensor design and wafer processing of photo sensors within the framework of a CMOS process.

BACKGROUND OF THE INVENTION

Photodetectors are integrated into semiconductor circuitry, for specialized processors that can drive a wide variety of opto-electronic devices. Important photodetector performance criteria include:

a) efficiency and wavelength dependence of electron-hole pair generation from incident photons.

b) efficiency in transporting electron-hole pairs to the collection region where current is measured.

c) generation of electron-hole pairs in the device in the absence of light ("dark current" noise).

Generation. Transport And Collection Of Electron-Hole Pairs

Energy absorbed in a semiconductor can excite a valence band electron into the conduction band. The excitation energy required is called the bandgap energy. When an electron is excited to the conduction band, a hole is left behind in the valence band. This process is commonly called electron-hole pair generation.

The generation of an electron-hole pair temporarily increases the charge carrier concentration in the semiconductor beyond the steady-state value defined by the mass action law ($np=n_i^2$). ("n") is the free electron concentration. ("pw") is the free hole concentration. $n_i=p_i$ are the natural intrinsic carrier concentrations in pure defect free silicon at a given temperature. Electron-hole pair generation increases both n-type and ptype carrier concentrations by the same amount, but in a doped semiconductor, the minority carrier concentration is often significantly increased while the percentage increase in concentration of abundant majority carriers is very small. Excess minority carriers (electrons in a p-type semiconductor or holes in an n-type semiconductor) can then survive only a short time before recombining with abundant majority carriers to reestablish the steady-state carrier concentration. The average time that a minority carrier survives is inversely proportional to the majority doping concentration in the material. In a doped semiconductor, as long as the carrier generation level is low enough that the minority carrier concentration does not approach that of the majority type, carrier generation is proportional to the energy absorbed.

A p-n junction diode can be used to collect minority carriers before they recombine, producing a current proportional to the amount of energy absorbed by the semiconductor. By applying a reverse bias (positive voltage on the n-type terminal and relative negative voltage on the p-type terminal), an electric field is established across the depletion layer of the junction. Excited electrons in the p-side that diffuse to the depletion layer boundary are swept to the n-side due to the electric field, and excited holes in the n-side that reach the boundary are drawn across to the p-side. This flow of carriers from the minority side to the majority side of the p-n junction is measured as a reverse current in the diode and is proportional to the energy absorbed near the p-n junction. Collection and measurement of the electron-hole pairs generated in such a structure thus requires a junction proximal to the point of carrier generation and relatively low doping to allow diffusional transport to the junction boundary before recombination.

Photo-Excitation Of Electron-Hole Pairs

Silicon absorbs light energy from the visible and near infrared spectrum thereby generating electron-hole pairs. The light-generated electron-hole pairs are measured for photo detection. Short wavelength (high energy) blue light is most readily absorbed (90% absorption at ~1 $\mu$m depth). Longer wavelength red light travels deeper before absorption (90% absorption at ~10 $\mu$m depth).

Collecting the charge created from light absorption requires that the charge be generated within or near the depletion region that surrounds the p-n junction boundary. Electron-hole pairs generated within this region are immediately separated due to the reverse bias field, and contribute to the collected charge. The charge generated outside this region can also contribute to the collected charge if the minority carriers travel to the boundary of the junction. Because the depletion region width (a few tenths of a micrometer) is much smaller than the depth of light collection, the primary means of photocurrent collection is through transport of carriers to the depletion boundary.

Measuring Only The Light

Incident light energy is normally measured indirectly from the amount of electron hole pairs generated by light absorption. An ideal photodetector would measure only the light energy absorbed in the semiconductor. However, there are sources other than light that contribute to electron-hole pair generation.

For example, thermally generated electron-hole pairs can significantly add to the reverse current in the p-n junction. Thermally generated carriers are often concentrated at the surface of the semiconductor due to the discontinuity in the lattice structure. The discontinuity results in energy states within the forbidden energy gap that enhance carrier generation. Mechanical stress in the semiconductor die also enhances carrier generation. In a CMOS fabrication process that uses LOCOS isolation, stress is concentrated at the tip of the $SiO_2$ isolation structure known as a "bird's beak". Carriers generated by mechanical stress and thermal excitation are collected by a photo detector just as those generated by light.

The process of photo detection is degraded by these non light-based electron-hole pair generation sources because it takes some amount of light-generated current to produce a signal level large enough to overcome the dark current. It would therefore be desirable to minimize the effect of these other electron-hole pair generation sources.

SUMMARY OF THE INVENTION

It is the object of the present invention to produce more efficient photo sensors based on integrated circuitry optimized within the CMOS process framework. The present invention mitigates the nominal degradation of integrated photo sensor performance by implementing specific doping profiles and design geometries. For example, some embodiments of the present invention use low doping concentrations to create a p-n junction that reduces the number of majority carriers available for recombination Some embodiments grade the doping profile in the p-type and/or n-type terminals of the diode in a manner to create a built-in electric field throughout the region where light absorption occurs. This causes minority carrier drift away from the more highly doped region. The minority carrier drift mechanism is designed to direct minority carriers towards the p-n diode junction. However, the designs of the present invention do not significantly alter the base process required to fabricate the rest of the integrated circuit (IC) device. The designs of the present invention increase the output signal by maximizing the conversion of light energy to output current. Furthermore, the present invention decreases dark current by minimizing the conversion of other energy sources to output current. The present invention thereby maximizes the photo sensor dynamic range.

Other objects, features, and advantages of present invention will be apparent from the accompanying drawings and from the following detailed description.

BRIEF DESCRIPTION OF THE DRAWINGS

The objects, features, and advantages of the present invention will be apparent to one skilled in the art in view of the following detailed description in which:

FIG. 1a illustrates a cross-section of a standard CMOS nplus-pwell photo sensor.

FIG. 1b illustrates a qualitative impurity concentration profile against depth, along the line x–x' in FIG. 1a.

FIG. 2a illustrates a schematic of a standard CMOS compatible nwellp(epi)/pwell photo sensor with first layer active LOCOS $SiO_2$.

FIG. 2b illustrates a typical doping controlled carrier concentration against depth, along the lines y–y' and z–z' in FIG. 2a.

FIG. 3a illustrates a schematic of a CMOS compatible nwellp(epi)/pwell photo sensor with monotonic carrier concentration gradient and guard rings.

FIG. 3b illustrates a typical doping controlled carrier concentration vs depth, along the line x–x' in FIG. 3a.

FIG. 4a illustrates a plot of doping profiles of a photo detector with a surface minority carrier trap along the line x–x' of nplus/pwell photo detector as in FIG. 3a.

FIG. 4b illustrates a doping profile of a photo detector with a surface minority trap along the line y–y' of n-well detector as in FIG. 3c.

FIG. 5a illustrates a schematic of a CMOS nwell-p(epi)/pwell photo detector with monotonic carrier concentration gradient and surface guarding.

FIG. 5b illustrates a plot of doping controlled carrier concentration vs. depth, along the line x–x' in FIG. 5a.

FIG. 5c illustrates a schematic of a CMOS nwell-p(epi)/pwell photo detector with monotonic carrier concentration gradient and surface guarding.

FIG. 5d illustrates a plot of doping controlled carrier concentration vs. depth along the line y–y' in FIG. 5c.

DETAILED DESCRIPTION OF THE PREFERRED EMBODIMENT

A method and apparatus for implementing an efficient photo sensor is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to CMOS image sensors. However, the same techniques can easily be applied to other types of electronic image sensors.

Standard CMOS Process Photo Sensors

Figures 2A, 2B:
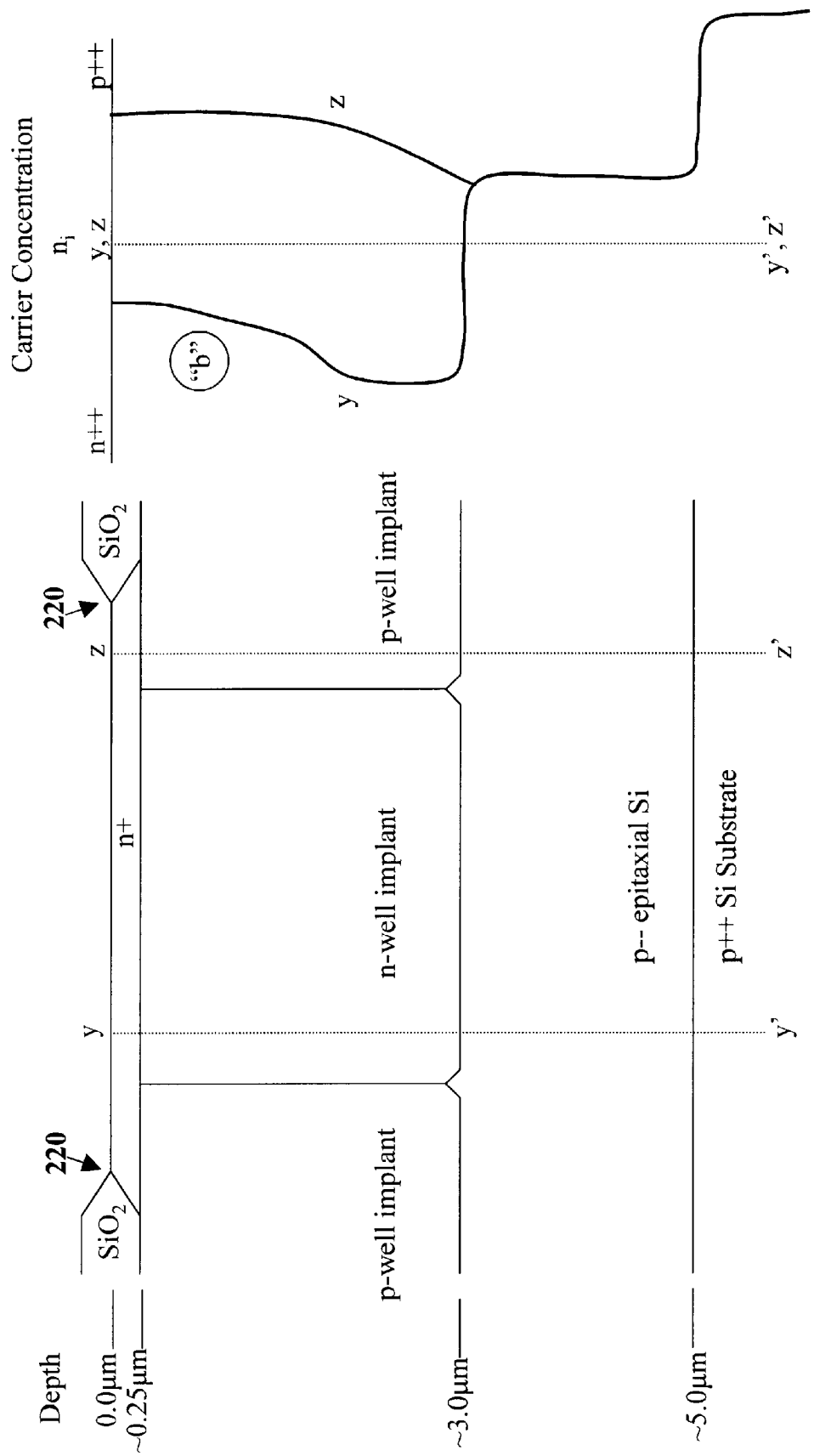

FIGS. 1a and 2a illustrate cross-sections of two photo sensors available in a standard Complementary Metal-Oxide-Silicon (CMOS) process. In both photo sensors, a lightly p-doped epitaxial Silicon (Si) layer is grown on a highly p-doped Si substrate. Active circuitry is formed (among several other steps not relevant to the foregoing description) by selectively implanting doped regions into these base layers using implant masks. For cost-effective manufacturing, the number of mask steps in the process is minimized. A standard CMOS process as we refer to it here uses at least four implant masks to form complementary NMOS and PMOS transistors: (1) the relatively deep, low-concentration p-type bulk of the NMOS device is formed by implanting through the pwell mask; (2) the shallow, high-concentration n-type source and drain terminals of the NMOS device are formed using the nplus mask; (3) the relatively deep, low-concentration n-type bulk of the PMOS device is formed using the nwell mask; and (4) the shallow, high-concentration p-type source and drain terminals of the PMOS device are formed using the pplus mask.

Doping Profiles Of Photo Sensors In Standard CMOS Processes

FIG. 1a illustrates, in cross-section, a standard nplus-pwell diode photo sensor implemented in standard CMOS. In the p-well photo sensor of FIG. 1a, a highly doped n+ source/drain has been implanted into a p-well region. FIG. 1b schematically illustrates carrier concentration as a function of depth along the line from x to x' in FIG. 1a. Note that the p-well is retrograded so that the doping concentration increases with depth. The retrograded doping concentration is good for light collection because minority carriers (electrons) are pushed toward regions of lower p-type doping, up toward the n+ junction where current is collected. However, the lowly doped p-epitaxial layer creates a minority carrier trap indicated by the circled "a" in the doping profile. This minority carrier trap blocks minority carrier transport to the surface from depths below ~3 μm. By blocking minority carriers from below 3 μm, the photo sensor exhibits poor green and red light response.

FIG. 2a illustrates an n-well source-drain diode photo sensor implemented in a standard CMOS process. In the n-well photo sensor embodiment of FIG. 2a, the p-well is retrograded such that the doping concentration increases with depth as illustrated in doping profile of FIG. 2b. The retrograde doping results in a minority carrier (hole) trap at the surface indicated by the circled "b" in the doping profile of FIG. 2b. This minority carrier trap at the surface results in poor blue and green response in the photo sensor. Another minority carrier trap exists in the center p-well area, between the n-well diodes. This is due to the retrograde doping of this region, which makes the concentration higher at its borders.

Thus, it can be seen from FIGS. 1a, 1b, 2a, and 2b that the doping profiles of both the standard n-well and p-well photo sensor structures cause such photo sensors to perform less than optimally.

Dark Current Sources in Standard CMOS Photo Sensors

The LOCOS process is one of the most commonly used CMOS processes. The LOCOS process is a "first layer active" process that forms the distinctive $SiO_2$ "bird's beak" structure 220 as illustrated in FIG. 2a. The bird's beak structure 220 degrades photo detector performance by creating a mechanical high stress area near the tip of the bird's beak. The mechanical high stress area produces excess dark carrier generation. Furthermore, discontinuities in the lattice structure of the device cause thermally generated electron-hole carriers. These thermally generated electron-hole carriers cause further dark current.

Much of the dark current carriers resulting from thermal and mechanical means are localized at known areas. Thus, in a large part, the photo-generated carriers can be physically isolated from the dark current sources. This isolation allows significant control of photo sensor performance by adjusting the three-dimensional doping profile. Use of a high doping concentration at the surface and around the bird's beak can increase the recombination rate in these areas and thus reduce dark current. However, since both dark current mechanisms and blue light absorption are concentrated near the surface, it is difficult to reduce dark current without also losing photo sensor response to blue light.

An Improved CMOS Photo Sensor Design

The present invention introduces novel photo sensor designs that improve photocurrent collection efficiency. The various photo sensor designs of the present invention improve CMOS photocurrent collection efficiency by decreasing the recombination rate of photo-generated carriers. Furthermore, the designs of the present invention increase the rate of carrier diffusion toward the p-n junction. The present invention uses low doping concentrations to create a p-n junction. This reduces the number of majority carriers available for recombination. The present invention further grades the doping profile in a manner to create a built-in electric field throughout the region where light absorption occurs to further enhanced photocurrent collection. This electric field causes a minority carrier drift away from a more highly doped region. The minority carrier drift mechanism directs minority carriers towards the p-n diode junction. Finally, the present invention uses high doping in areas known to generate dark current. This increases the rate of recombination, decreasing the probability of capturing charge from dark sources.

These designs are novel in concept and application because they offer a methodology to apply modified doping profiles to n-well or p-well photo sensors with or without a first layer active LOCOS oxide structure, and within the limitations of the well-known CMOS process. The doping modifications are generally made during the doping steps of the original CMOS process, although extra mask steps may be added, where they do not interfere with other CMOS process steps.

The doping profiles are modified from the standard CMOS process illustrated in FIGS. 1a and 2a. These modifications are common to different designs, and are applicable in the following Figures. FIGS. 3a, 3b, 4a, 5a and 5b illustrate designs for a p-well photo sensor structure. FIGS. 3c, 3d, 4b, 5c and 5d illustrate designs for an n-well photo sensor structure.

FIGS. 3a–3d illustrate CMOS photo sensor embodiments having monotonic carrier concentration gradient and guard rings around the tip of the CMOS LOCOS bird's beak. These two modifications improve the efficiency of the photo sensors.

A Modified P-well Device

Figures 3A, 3B:
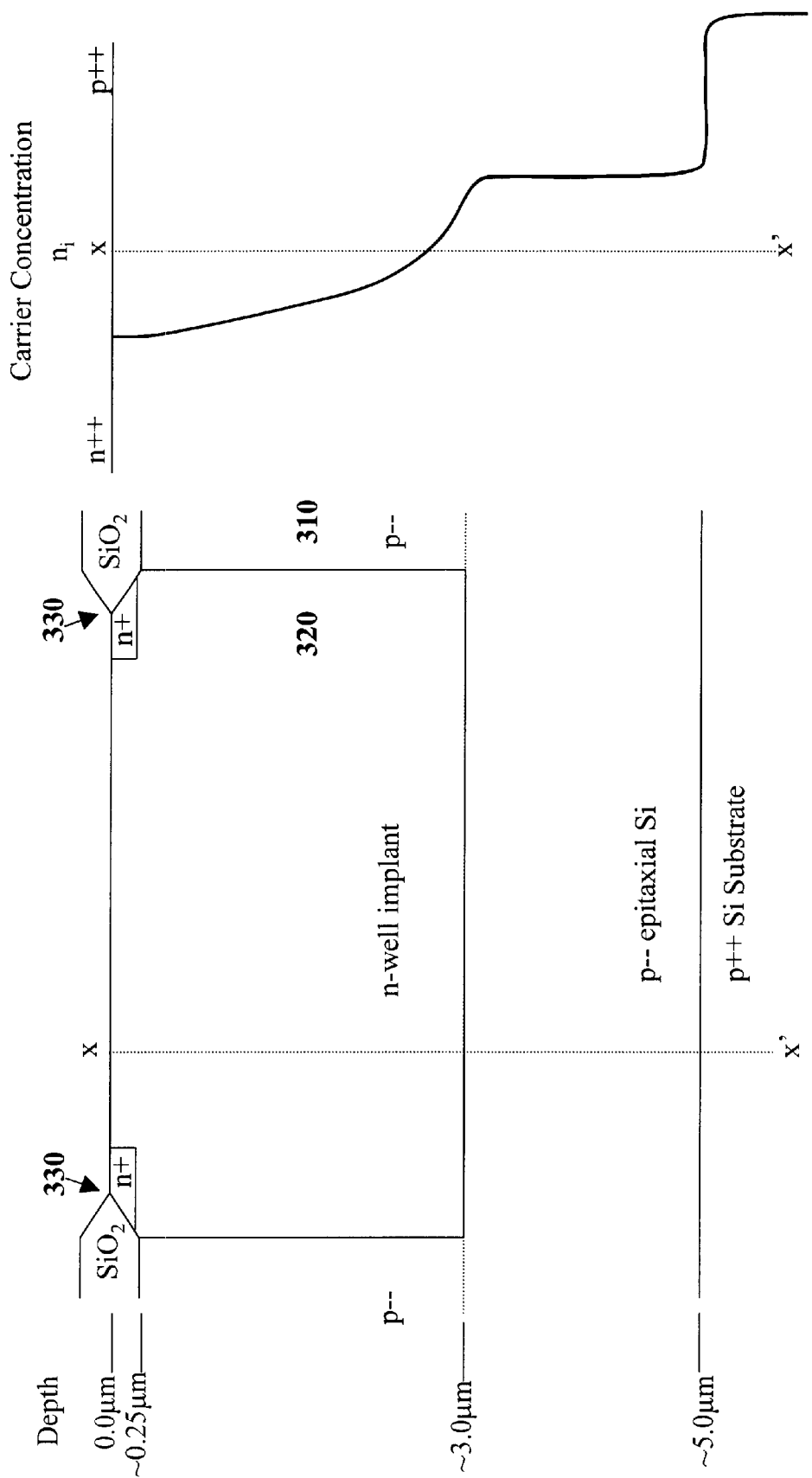

FIG. 3a illustrates a modified p-well photo sensor device. The modified p-well photo sensor of FIG. 3a includes three modifications to the standard process of FIG. 1a. The p-well implant that produced the retrograde p-type doping and the electron trap at the p-epi layer in FIG. 1a is omitted by means of an extra masking step. The region labeled 310 thus remains p-epi with low doping that minimizes recombination of photo-generated carriers. A graded, lightly doped n-layer is implanted 320 to form a diffused p-n junction that has the doping profile illustrated in FIG. 3b. The doping level throughout the n-type region is low, minimizing recombination of photo-generated carriers.

The doping level also decreases monotonically with depth, thereby creating an electric field that points downward toward the p-n junction. This electric field enhances minority carrier (hole) drift towards the junction and increases collection of photo-generated current. Guard rings 330 are formed by heavy n+ implants at the surface of the device, near the tip of the $SiO_2$ bird's beak. Dark current carriers generated locally at the bird's beak, because of mechanical stress induced energy levels in the Si forbidden gap, recombine in the n+ region before they can diffuse into the active region of the device.

A Modified N-well Device

Figures 3C, 3D:
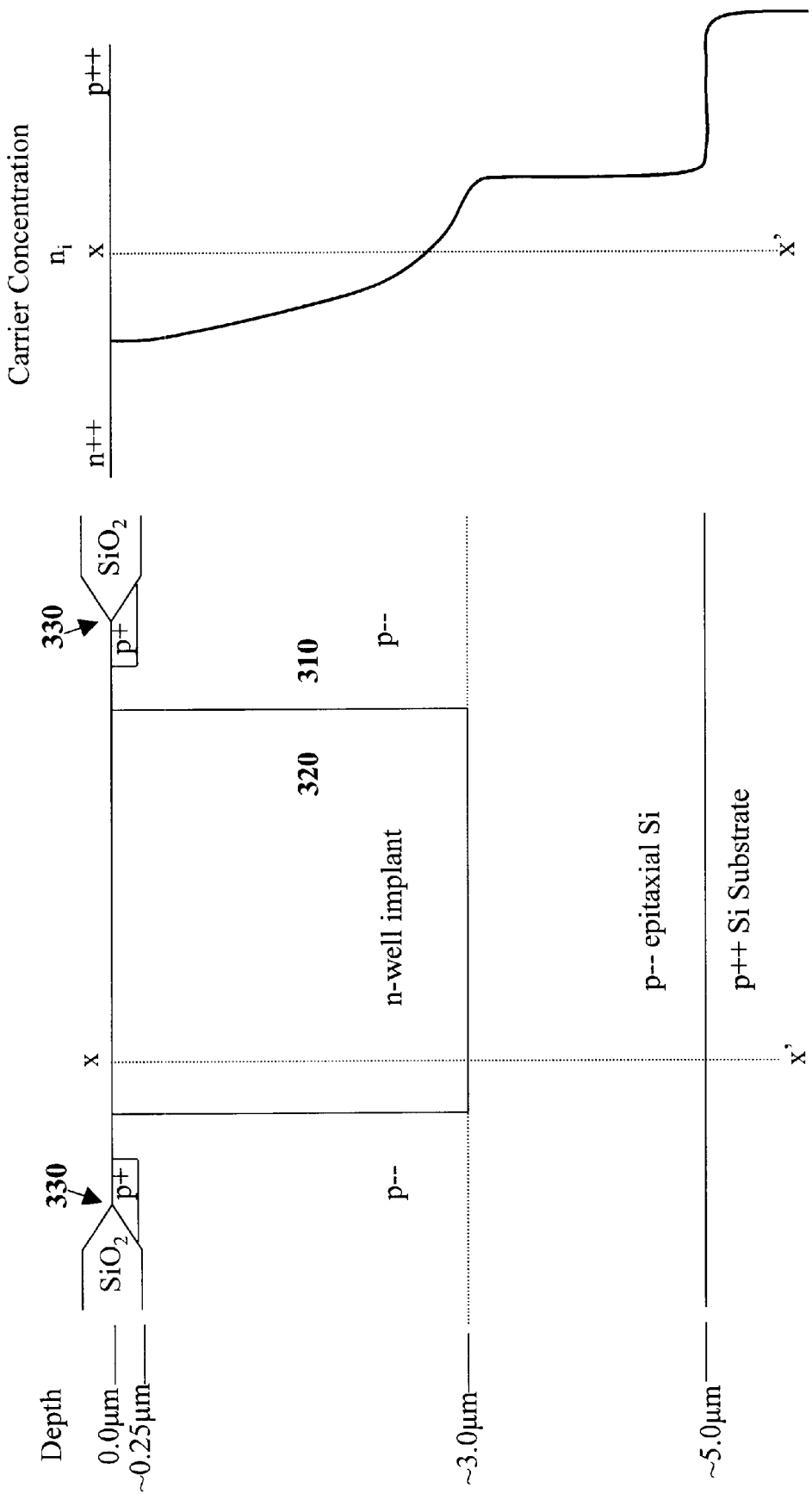
FIG. 3c illustrates a schematic of a CMOS n-well photo detector with monotonic carrier concentration gradient and guard rings.
FIG. 3d illustrates a plot of doping controlled carrier concentration against depth, along the line y–y' in FIG. 3c.

A similar doping profile can be used in an n-well photo sensor by modifying the standard n-well CMOS process of FIG. 2a. The device geometry of the modified device is slightly different as illustrated in FIG. 3c. The n-well process requires the photo diode to be well within the active area defined by the bird's beak because there is a p+ region to n region spacing rule that must be followed.

Omission of the p-well implant by means of an extra masking step again extends the p-epi layer into the region labeled 310, thereby minimizing recombination of photo-generated carriers. The n-well implant is further modified to replace the retrograde doping of FIG. 2b by the graded, lightly doped n-layer profile of FIG. 3d. The low n-type doping, decreasing monotonically with depth, again enhances hole drift towards the p-n junction and increases collection of photo-generated current. P-type material surrounds the $SiO_2$ bird's beak structure in this geometry, and a p+ implant is used to form the guard rings 330.

Thermally Generated Dark Current Reduction

The photo sensor designs may also be modified to reduce dark current related to surface effects. Surface states in the forbidden gap of Si significantly increase the concentration of thermally generated carriers. FIGS. 4a and 4b illustrate the doping profile of embodiments having a minority carrier trap at the surface. The p-well and nwell geometries are identical to those in FIGS. 3a and 3c. Only the surface region of the n-implant is modified.

For both n-well and p-well processes, the doping concentration of the nimplant is decreased at the surface, as shown in FIGS. 4a and 4b respectively. Thus, the n-type doping concentration peaks at a very shallow depth, and then decreases toward the p-n junction. This sets up an electric field directed toward the surface at points shallower than the concentration peak, and toward the junction at points deeper than the peak. This serves to trap minority carriers at the surface until they recombine, decreasing dark current resulting from surface effects.

Another embodiment employs whole-surface guarding to decrease dark current from both mechanical stress at the bird's beak and from thermally generated carriers at the surface. The geometries and doping profiles of both the p-well and n-well modified processes are shown in FIGS. 5a–5d. P-well omission and a low dopant concentration graded n-well may be included as in previous embodiments. High n-type doping is added across the surface of the p-well device, in region 530 of FIG. 5*a*, to form the doping profile shown in FIG. 5*b*. High p-type doping is employed at the surface of the n-well device, in region 530 of FIG. 5*c*, to form the doping profile shown in FIG. 5*d*. In this case the surface doping increases carrier recombination and produces a profile that traps carriers generated near the surface.

The foregoing has described a method for implementing an electronic image sensor. It is contemplated that changes and modifications may be made by one of ordinary skill in the art, to the materials and arrangements of elements of the present invention without departing from the scope of the invention.

I claim:

1. An electronic image sensor apparatus, said apparatus comprising:

an n-well implant with a monotonically graded dopant that eliminates minority carrier traps; and highly doped guard rings at regions where dark current originates, to locally increase carrier recombination.

2. The apparatus as claimed in claim 1 further comprising:

a surface recombination trap created using highly doped near a surface.

3. The apparatus as claimed in claim 1 wherein said electronic image sensor device comprises a p-well diode structure.

4. The apparatus as claimed in claim 1 wherein said electronic image sensor device comprises an n-well diode structure.

5. The apparatus as claimed in claim 1 wherein said guard rings are placed near a $SiO_2$ bird's beak.

6. An electronic image sensor apparatus, said apparatus comprising:

an n-well implant with a monotonically graded dopant that eliminates minority carrier traps; and a highly doped surface recombination region.

7. The apparatus as claimed in claim 6 further comprising:

highly doped guard rings at regions where dark current originates to locally increase carrier recombination.

8. The apparatus as claimed in claim 6 wherein said electronic image sensor device comprises a p-well diode structure.

9. The apparatus as claimed in claim 6 wherein said electronic image sensor device comprises an n-well diode structure.

10. The apparatus as claimed in claim 6 wherein said guard rings are placed near a $SiO_2$ bird's beak.

* * * * *